United States Patent [19]
Yu

[11] Patent Number: 5,366,557
[45] Date of Patent: Nov. 22, 1994

[54] METHOD AND APPARATUS FOR FORMING INTEGRATED CIRCUIT LAYERS

[75] Inventor: Chen-Hua D. Yu, Allentown, Pa.

[73] Assignee: AT&T Bell Laboratories, Murray Hill, N.J.

[21] Appl. No.: 8,942

[22] Filed: Jan. 26, 1993

Related U.S. Application Data

[60] Division of Ser. No. 845,502, Feb. 28, 1992, Pat. No. 5,212,116, which is a continuation of Ser. No. 691,070, Apr. 24, 1991, abandoned, which is a continuation of Ser. No. 539,635, Jun. 18, 1990, abandoned.

[51] Int. Cl.$^5$ .............................................. C23C 16/00
[52] U.S. Cl. ................................. 118/725; 118/715; 118/723 E
[58] Field of Search ............ 118/715, 723, 725, 723 E

[56] References Cited

U.S. PATENT DOCUMENTS

| | | | |
|---|---|---|---|
| 5,000,113 | 3/1991 | Wang | 118/715 |
| 5,186,756 | 2/1993 | Benko | 118/725 |

FOREIGN PATENT DOCUMENTS

| | | | |
|---|---|---|---|
| 57-48226 | 3/1982 | Japan | 156/345 |
| 60-116126 | 6/1985 | Japan | 118/725 |
| 61-208222 | 9/1986 | Japan | 118/715 |

*Primary Examiner*—Richard Bueker
*Attorney, Agent, or Firm*—John T. Rehberg

[57] ABSTRACT

A method of forming a planarized or smoothed dielectric or other material layer upon a partially fabricated integrated circuit is disclosed. Conventional planarization techniques involve deposition of a dielectric or other material layer followed by anisotropic etchback. Unfortunately, some commercial equipment tends to etch the center of the wafer faster than the edges. The disclosed process forms a layer which is thicker in the central region than the edge region. Thus, when the disclosed process is followed by a conventional etchback, a planar dielectric or other material layer over the entire wafer is formed. Other aspects of the invention include processes and apparatus for producing smooth deposition and etching by control of the impedance of the etching and/or chemical precursor gases.

1 Claim, 2 Drawing Sheets

METHOD AND APPARATUS FOR FORMING INTEGRATED CIRCUIT LAYERS

This is a continuation division of application Ser. No. 07/845,502 filed Feb. 28, 1992, now U.S. Pat. No. 5,212,116, which is a continuation of Ser. No. 691,070, filed Apr. 24, 1991, now abandoned, which is a continuation of Ser. No. 539,635, filed Jun. 18, 1990, now abandoned.

TECHNICAL FIELD

This invention relates to integrated circuits and methods for their fabrication; more particularly, it relates to depositing and etching of various material layers used in fabricating integrated circuits.

BACKGROUND OF THE INVENTION

It is customary during the fabrication of integrated circuits to form various dielectric layers. These dielectric layers provide electric isolation between various portions of an integrated circuit. For example, in the fabrication of an integrated circuit containing field effect transistors (FETs), after the source gate and drain have been formed, a dielectric layer may be deposited to cover the source, gate and drain regions. The dielectric layer provides support for upper levels of metallization, while electrically isolating this metallization from the source, gate and drain.

As integrated circuits geometries continue to shrink, there is a growing desire within the semiconductor industry for processes which form dielectric layers with relatively planar surfaces. Planar dielectrics obviate depth-of-focus problems (which are often encountered when attempting to transfer patterns to non-planar surfaces) and make the formation of multiple levels of overlying metallization easier.

One popular technique for forming a (relatively) planar surface is to form a dielectric, typically by deposition of silicon dioxide from an organometallic precursor gas or from silane. Then the dielectric is etched back (with or without the assistance of an overlying resist material). Experience has shown that the etchback of the relatively conformal silicon dioxide layer produces a resulting dielectric with a comparatively (at least locally) planar surface.

Practical experience in the semiconductor industry has shown that various machines under certain circumstances tend to preferentially etch a dielectric layer in the center of the wafer. Consequently, the dielectric layer covering chips cut from dice located near the center of the wafer may be etched more (and be therefore thinner) than the dielectric layer of chips cut from dice located near the edge of the wafer. This non-uniformity in machine etching makes it difficult to predictably control planarization techniques such as the above-mentioned deposition and etchback technique.

Although the above discussion has been directed toward dielectrics, similar problems may be observed with respect to deposition and etching of metals and polysilicon or amorphous silicon.

SUMMARY OF THE INVENTION

In an illustrative embodiment of the present invention, a material layer is formed upon a wafer. The thickness of the material layer is greater over a first portion of the wafer than over a second portion of the wafer. Then, some of the material layer is etched by a process which preferentially removes the material over the first portion of the wafer.

Another illustrative embodiment of the present invention includes the formation of a material layer which is thicker at the center of the wafer than at the edge by depositing the material from precursor gas molecules in a reactor having a shower head positioned opposite the wafer by decreasing the impedance seen by those gas molecules which are directed through the shower head toward the center of the wafer.

An additional aspect of the invention includes etching a material layer in a reactor with a shower head. The reactor directs gas particles through the shower head such that the impedance of said gas particles emanating from the center of the shower head is less than the impedance of gas particles emanating from the edge of the shower head. Consequently the etch rate in the center of the material layer is approximately equal to the etch rate at the edge of the material layer.

Further aspects of the invention include apparatus for forming material layers.

DETAILED DESCRIPTION

Figure 1:
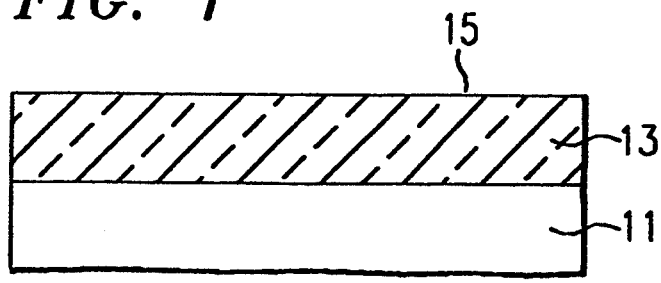
FIGS. 1–7 are cross-sectional and perspective views presenting illustrative embodiments of the present invention.

FIG. 1 depicts in cross-section a semiconductor wafer during its fabrication process. Reference numeral 11 denotes a substrate which may be silicon or epitaxial silicon. Details of individual transistors, including gates, sources, drains, runners, field oxides, etc., and other features have been eliminated for the sake of clarity. Those skilled in the art will readily understand that such details are not depicted. Reference numeral 13 denotes a dielectric layer formed on top of substrate 11. The upper surface 15 of dielectric layer 13 is illustrated as being comparatively flat although it may contain (and almost certainly does) various microscopic bumps and irregularities caused by its formation over an underlying bumpy topography comprising, for example, field oxides and gate stacks or gate runners. However, since FIG. 1 is intended to represent the cross-section of an entire wafer, small irregularities in upper surface 15 are not depicted.

Typically, the dielectric layer may be formed by the decomposition of tetraethylorthosilane, sometimes abbreviated TEOS, or from the decomposition of a variety of other known precursor gases or from silane. In illustrative embodiments, the average thickness of dielectric layer 13 is between approximately 0.5 $\mu$m and 3 $\mu$m.

Typical semiconductor processing frequently involves etching back upper surface 15 of dielectric layer 13 by various etchback techniques. These etchback techniques serve to smooth out and somewhat planarize the microscopic irregularities previously mentioned. The etching procedure may be accomplished by a variety of techniques well known to those skilled in the art, including plasma reactive ion etching or resist-etchback techniques.

Figure 2:
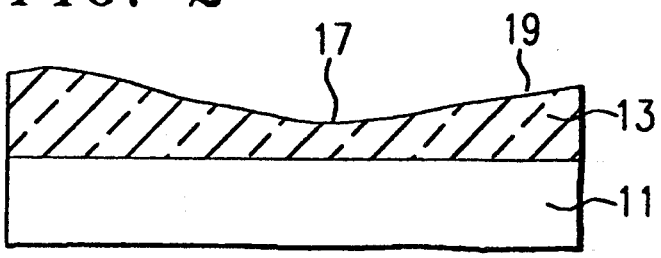

Under certain conditions, the result of the antecedent etchback procedure is illustrated in FIG. 2. It will be noted that the final thickness of dielectric layer 13 varies across the wafer. In particular, the average thickness of dielectric 13 near the center, denoted by reference numeral 17, is less than the average thickness of dielectric layer 13 near the outer edge of the wafer, denoted by reference numeral 19. Consequently, the deposition-/etchback procedure depicted in sequence by FIGS. 1 and 2 may produce integrated circuits with unacceptable variations in dielectric layer thickness. Thus, integrated circuits diced from the center of the wafer will have dielectric layers which are thinner than circuits diced from the edge of the wafer.

Figure 3:
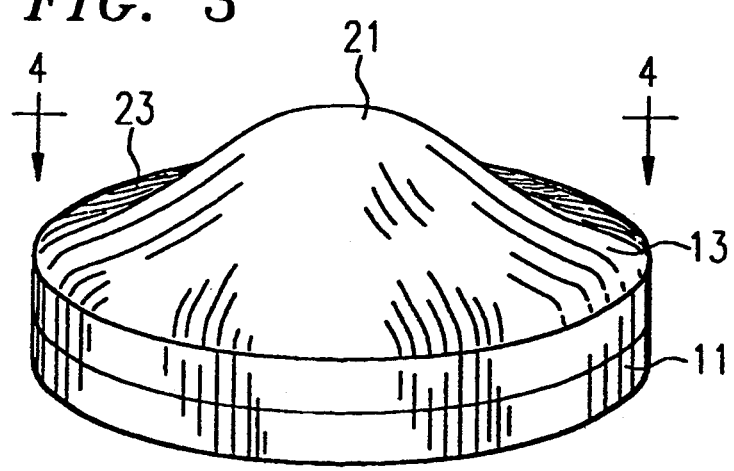
Figure 4:
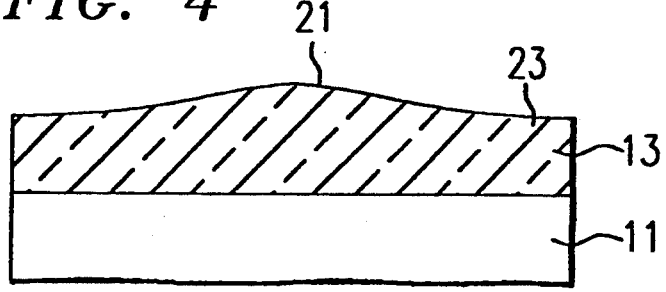

One illustrative embodiment of applicants' invention which substantially reduces the above-mentioned dilemma is partially illustrated by the perspective view of FIG. 3 and cross-sectional view of FIG. 4. As will be appreciated from these figures, dielectric layer 13 is formed by a process which produces a dielectric with a slightly greater thickness in the center of the wafer and a thinner thickness at the edges of the wafer. Consequently, when an etchback process which preferentially attacks the center of the wafer is employed, the resulting final dielectric thickness is comparatively more uniform across the wafer.

Figure 5:
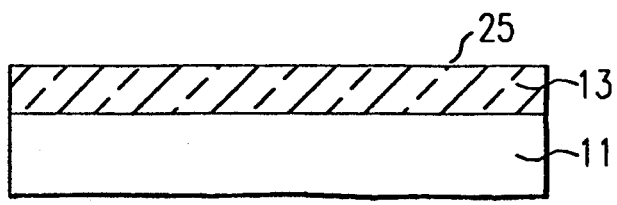

Specifically, turning to FIGS. 3 and 4, reference numeral 11 denotes a semiconductor substrate. Details of individual transistors, including gates and field oxides, have not been depicted, as before. Nevertheless, as mentioned before, it must be noted that these individual features contribute to topographic irregularities in the upper surface of dielectric 13. It is desired to smooth out and at least locally planarize these surface irregularities by a deposition/etchback scheme. In FIG. 3, it will be noted that dielectric 13 has been deposited so that it is somewhat thicker in the center 21 than at the edge 23. Consequently, when an etchback procedure is employed which preferentially attacks the center 21 of dielectric 13, a comparatively uniform, flat dielectric such as depicted in FIG. 5 with a relatively planar upper surface 25 is produced. Of course, the contours of upper surface 21, 23 of dielectric 13 should be matched to the non-uniformity of the etchback process to produce comparatively flat dielectric 13 illustrated in FIG. 5. The next few paragraphs will present some specific details concerning how the desired dielectric shape and etching are to be performed. For convenience, the shape of dielectric 13 depicted in FIGS. 3 and 4 may be referred to as a dielectric with a "dome" profile. The shape of the dielectric produced by etching an initially comparatively flat dielectric such as that illustrated in FIG. 2 is termed a "bowl" profile.

For example, a dome-shaped deposition profile for dielectric 13 (FIGS. 3–4) was obtained in an AMI 5000 machine manufactured by Applied Materials Incorporated. A plasma-enhanced TEOS film (PETEOS) of approximately 1 $\mu$m in average thickness was deposited upon a bare silicon wafer of five inch diameter. The susceptor temperature was maintained at 390° C. Chamber pressure was 8 Torr. (Standard processes utilize a chamber pressure of approximately 9–10 Torr.) The power was 350 watts. Spacing between the susceptor and shower head was 200 mils. (Standard spacing is approximately 190 mils.) TEOS and oxygen flow rates were both 425 ±50 sccm (standard TEOS flow rate is approximately 380 sccm and standard oxygen flow is approximately 425 sccm). (Flow-rate calibration was performed when the temperature of the deposition chamber was approximately 390° C.) A dielectric deposition rate of 110–130 Å per second was obtained. Referring to FIG. 3, the thickness of the deposited dielectric 13 measured by Prometrix apparatus was approximately 10350 ±100 Å at the center 21 of the wafer. The thickness at the edge 23 of the wafer was approximately 9850 ±100 Å.

Figure 6:
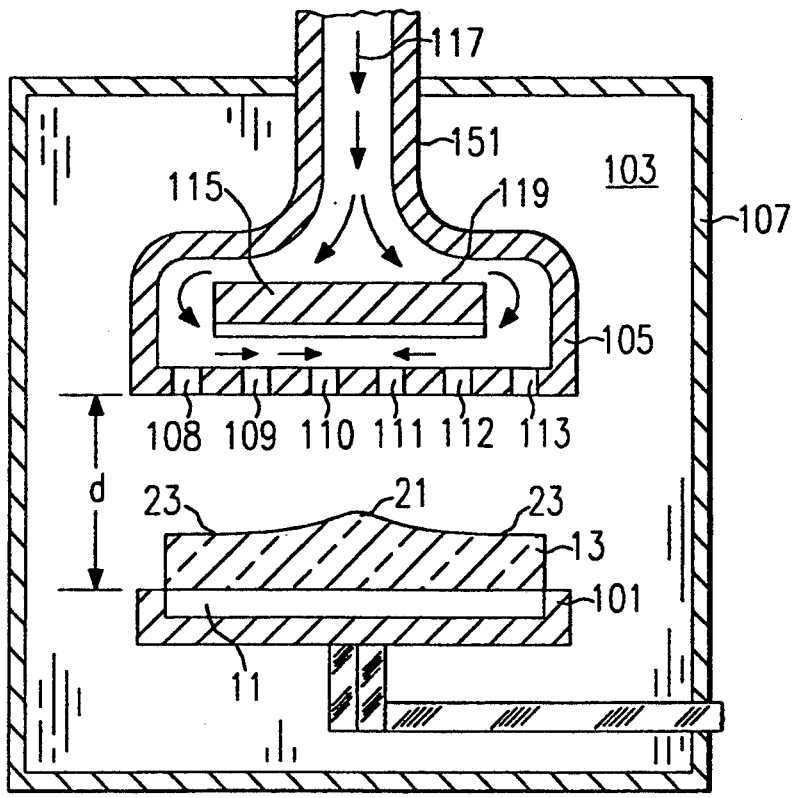

Applicants hypothesize that the non-uniform deposition can be explained as follows. Referring to FIG. 6, there is shown a deposition reactor 103 that may be used for depositing various materials including silicon dioxide in accordance with an illustrative embodiment of the invention. Reactor 103 includes generally parallel electrodes 101 and 105 between which a radio frequency plasma is formed. Reactor 103 may be of the general type known as the "precision 5000 system," commercially available from Applied Materials Incorporated of Santa Clara, Calif. Electrode 105 is excited with radio frequency energy, typically 13.56 Mhz, from a radio frequency source not depicted. Electrode 101 is grounded. Typically, electrode 101 is termed a "susceptor" and supports silicon substrate 11 upon which a dielectric layer 13 is to be deposited. The silicon component of the silicon dioxide for deposition is obtained from gaseous TEOS derived from a heated liquid source not shown. Typically, TEOS is commercially available as a liquid and a vaporized form may be obtained by bubbling helium from a source through the liquid TEOS and deriving vaporized molecules from the TEOS. Preferably also included in the plasma atmosphere is oxygen gas that may be derived from a separate source. Various flow meters and other apparatus for injecting controlled amounts of the desired gases are known in the an and for the sake of brevity have not been shown or described. Enclosure 107 surrounds the aforedescribed apparatus and permits creation of desired pressure environment. The radio frequency driven electrode 105 is often termed a "shower head." The shower head contains a plurality of apertures 108–113. Since the drawing of FIG. 6 is merely schematic, the number of apertures in the illustration does not, necessarily, correspond to the exact number of apertures in the actual machine. Baffle plate 115 is positioned within the center of shower head 105. As the TEOS and oxygen gases, denoted by reference numeral 117, are introduced into shower head 105, they strike baffle plate 115 and flow outwardly (radially) and around baffle 115. The upper surface 119 of baffle 115 is generally smooth and flat. However, as shown in FIG. 7, the under surface 123 of baffle 115 contains a series of radial grooves 121.

Figure 7:
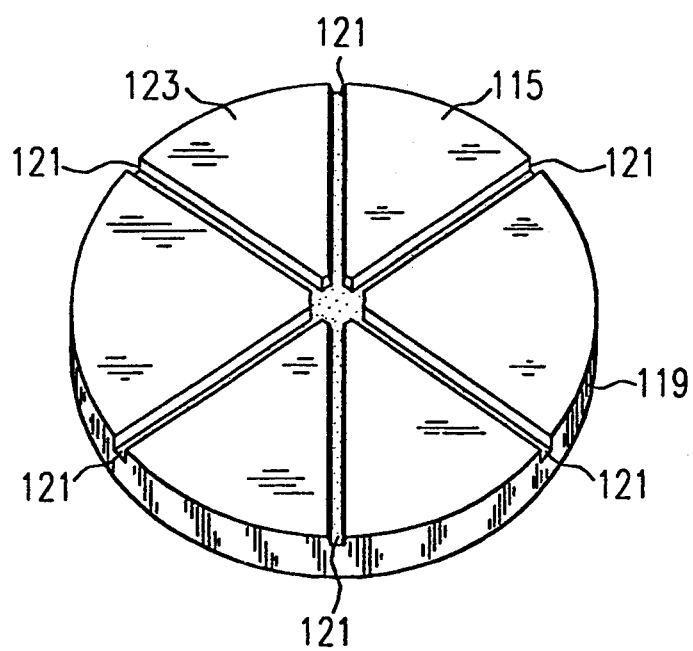

Another depiction of baffle 115 is found in FIG. 7. There is illustrated the underside 123 of baffle 115 with a plurality of grooves 121. Grooves 121 help to channel some of the gas mixture flowing within shower head 105 towards the center of the shower head. All of the incident gas is channeled toward the center. However, some of the gas 117 exits through outer openings such as 108, 109, 112 and 113 (FIG. 6), whence it is deposited upon substrate 11 in the form of dielectric 13.

Susceptor 101 is heated by a plurality of lamps not shown that transfers heat relatively uniformly to substrate 11. The purpose of the above-mentioned radio frequency plasma is to ionize and thereby to provide sufficient additional energy to molecules of the incident gas to permit chemical vapor deposition of silicon dioxide on the surface of substrate 11 from the silicon and oxygen components of the incident gas.

Applicants hypothesize, as mentioned above, that the deposition mechanism may be understood by considering the total impedance experienced by the gas molecules as they traverse the path from the upstream portion 151 of shower head 105 to their ultimate destination upon the surface of substrate 11. It will be noted that for molecules exiting from openings such as 110 and 111 near the center of shower head 105, a higher impedance path is presented. High impedance is due to the extra travel experienced by these molecules as they traverse grooves 121 and baffle plate 115. Consequently, applicants believe that a pressure gradient obtains along the gas path in grooves 121. Other contributing factors to the total impedance to gas flow are the total chamber pressure, the spacing d between shower head 105 and susceptor 101, and the size of openings 108-113 in shower head 105. Since the gas molecules within chamber 107 and particularly in the plasma between shower head 105 and susceptor 101 are beers to gas flow, the impedance is expected to decrease as overall chamber pressure decreases and/or electrode spacing d increases. Of course, both an increase in the size of holes 108-113 and an increase in groove width toward the center of baffle 115 may also be expected to decrease the total gas flow impedance. Particularly, if center holes such as 110 and 111 are increased slightly relative to edge holes 108 and 113, the impedance may be equalized. Thus, the aforementioned process produces a dome-shaped deposition profile by slightly increasing the TEOS flow rate, while slightly decreasing the total pressure and increasing the spacing between susceptor and shower head. (All variations are approximately 10-20% different from standard process parameters, which provide a flat profile.)

The inventive principles above are applicable to a variety of deposition and etching apparatus made by various manufacturers. (Incidentally, bowl-shaped profiles may be created by slightly decreasing the TEOS flow rates while increasing the total pressure and decreasing the spacing between susceptor and shower head—all variations by approximately 10-20%.)

The foregoing discussion has placed some emphasis upon the complementary deposition and etching of dielectrics. However, the invention is not so limited. The techniques described above may be applied to the deposition and etching of metals (e.g. tungsten, aluminum) and other materials (e.g. amorphous silicon). For example, should there be an etching process for tungsten which etches preferentially in the center of the wafer, then the tungsten may be deposited by a process which deposits the tungsten more thickly in the center of the wafer. The combination of deposition and etching will produce tungsten with comparatively uniform thickness from chip to chip.

If, for any particular material, there be an etching process which produces a non-uniform (though not necessarily bowl-shaped) surface across a wafer, then the principles described above may be applied. For example, if an etching process inherently produces dome-shaped layers (i.e., etches faster on the sides of the wafer than in the center), then a deposition process which preferentially deposits a bowl shape may be performed first. The two processes form a complementary combination. Should the etch process inherently produce a more complex shape, it may also be combined with a complementary deposition process to produce a uniform layer.

Furthermore, although the preceding discussion has referred to complementary deposit/etchback combinations, it may also be applied to deposition and plasma-etch patterning of various material layers, including dielectrics, metals, and semiconductors.

Of course, after the domed-shaped profile illustrated in FIGS. 3 and 4 has been obtained, it should be etched with an etchant process which preferentially attacks the center of the wafer. A typical recipe for performing such an etch is a mixture of $CHF_3$ and $O_2$ within a plasma excited by 13.56 $MH_z$ radiation using an Applied Materials 5000 machine.

The hypotheses mentioned above may also be employed to improve the etchback process itself. If the uniformity of the etchback process can be improved so that etching at the edge of the wafer occurs at the same rate as, for example, the center of the wafer, then the need for initial dome-shaped deposition may be eliminated.

Applicants hypothesize that the RIE etching process is governed by the same impedance considerations mentioned above in connection with deposition processes. As noted above, the presently used process tends to etch preferentially in the center of the wafer. Consequently, the etch process or equipment may be modified to increase the impedance of the gas molecules which ultimately strike the center of the wafer. For example, the holes in the center of the shower head may be made smaller than the holes at the edge of the shower head. The grooves in the baffle plate may be tapered so that their width is less near the center of the baffle plate than at the edge. Furthermore, the flow rate of the etchant gases may be slightly decreased while the total pressure of the etchant gases is increased. (Flow rate and pressure changes of 18-20% from standard values are likely acceptable.) Furthermore, the susceptor to shower head spacing may be decreased by approximately 10%. It may not be necessary for a particular application to include all of the above impedance-related modifications. For example, in certain etching processes, it may not be necessary to modify the shower head baffle plate construction because a combination of flow rate, total pressure, or susceptor spacing changes may suffice.

It is claimed:

1. An apparatus for forming a material layer upon a substrate comprising a shower head positioned generally above a susceptor;

said shower head enclosing a baffle plate, said baffle plate having a plurality of radial grooves, the width of said grooves being less near the center of said plate than at the edge.

* * * * *